(12) United States Patent
Zhao et al.

(10) Patent No.: US 11,563,076 B2
(45) Date of Patent: Jan. 24, 2023

(54) DISPLAY PANEL AND PREPARATION METHOD THEREOF AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Ning Zhao, Beijing (CN); Yue Wei, Beijing (CN); Xia Tang, Beijing (CN); Fuwei Zou, Beijing (CN); Guoqiang Yang, Beijing (CN)

(73) Assignees: Chengdu BOE Optoelectronics Technology Co., Ltd.; BOE Technology Group Co., Ltd., Beijing (CN)

( * ) Notice: Subject to any disclaimer, the term of this patent is extended or adjusted under 35 U.S.C. 154(b) by 70 days.

(21) Appl. No.: 17/333,070

(22) Filed: May 28, 2021

(65) Prior Publication Data

US 2022/0130937 A1 Apr. 28, 2022

(30) Foreign Application Priority Data

Oct. 27, 2020 (CN) .......................... 202011167209.9

(51) Int. Cl.
*H01L 27/32* (2006.01)
*H01L 51/52* (2006.01)
*G06F 3/041* (2006.01)
*H01L 51/56* (2006.01)

(52) U.S. Cl.
CPC ........ *H01L 27/3276* (2013.01); *G06F 3/0412* (2013.01); *H01L 27/323* (2013.01); *H01L 51/5253* (2013.01); *H01L 51/56* (2013.01); *H01L 2227/323* (2013.01)

(58) Field of Classification Search
CPC .............. H01L 27/3276; H01L 27/323; H01L 51/5253; H01L 51/56; H01L 2227/323; H01L 51/0031; H01L 51/525; G06F 3/0412
See application file for complete search history.

(56) References Cited

U.S. PATENT DOCUMENTS

| 2020/0161406 A1* | 5/2020 | Lee | G01R 31/2837 |
| 2020/0168671 A1* | 5/2020 | Jang | H01L 27/326 |
| 2020/0194714 A1* | 6/2020 | Won | H01L 27/3248 |

* cited by examiner

*Primary Examiner* — Kyoung Lee
(74) *Attorney, Agent, or Firm* — ArenFox Schiff LLP; Michael Fainberg

(57) ABSTRACT

Disclosed in embodiments of the present disclosure are a display panel, a preparation method thereof and a display apparatus. The display panel includes: a first blocking dam located in the blocking area and surrounding the hole area, a second blocking dam located on one side of the first blocking dam close to the hole area and surrounding the hole area, a heightening layer located between the first blocking dam and the second blocking dam, a crack detect wire located on one side of the second blocking dam close to the hole area, at least two connection leading wires leading the crack detect wire out to the display area through the blocking area; in a direction perpendicular to a plane where the display panel is located, an orthographic projection of an area between the connection leading wires has an overlap area with an orthographic projection of the heightening layer.

20 Claims, 4 Drawing Sheets

DISPLAY PANEL AND PREPARATION METHOD THEREOF AND DISPLAY APPARATUS

CROSS REFERENCE TO RELATED APPLICATIONS

The present application claims priority to the Chinese Patent Application No. 202011167209.9, filed to the China National Intellectual Property Administration on Oct. 27, 2020 and entitled "Display Panel and Preparation Method thereof and Display Apparatus", the entire contents of which are incorporated herein by reference.

FIELD

The present application relates to the technical field of display, in particular to a display panel and preparation method thereof and a display apparatus.

BACKGROUND

At present, on the market, most of mobile phone cameras are arranged on upper portion of screens. As each of the cameras has a certain size and usually occupies a large area of a frame of a whole phone, which severely affects a screen occupying ratio. With more attention of the mobile phone market to a full screen phone, a product with a camera in an AA hole of a hole area formed in a display area emerges and is of great interest in recent years.

SUMMARY

Embodiments of the present application provide a display panel, a preparation method thereof and a display apparatus.

An embodiment of present application provides a display panel, provided with: a hole area, a display area surrounding the hole area, and a blocking area located between the display area and the hole area;

the display panel includes: a first blocking dam located in the blocking area and surrounding the hole area, a second blocking dam located on one side of the first blocking dam close to the hole area and surrounding the hole area, a heightening layer located between the first blocking dam and the second blocking dam, a crack detect wire located on a side of the second blocking dam close to the hole area, and at least two connection leading wires leading the crack detect wire out to the display area through the blocking area; and in a direction perpendicular to a plane where the display panel is located, an orthographic projection of an area between the connection leading wires has an overlap area with an orthographic projection of the heightening layer.

In some embodiments, the display panel further includes: a base substrate, an encapsulation structure covering the display area and the blocking area, and a crack blocking structure located on one side of the crack detect wire close to the hole area in the blocking area;

the first blocking dam, the second blocking dam, the heightening layer and the crack blocking structure are located between the base substrate and the encapsulation structure; and the crack detect wire and the connection leading wires are located on a side of the encapsulation structure facing away the base substrate.

In some embodiments, the display panel further includes: a plurality of conductive layers located between the base substrate and the encapsulation structure in the display area; and the heightening layer and at least one of the conductive layers are arranged on the same layer.

In some embodiments, a thin film transistor pixel circuit and an electroluminescence device electrically connected with the thin film transistor pixel circuit are located between the base substrate and the encapsulation structure in the display area; and the conductive layers include: a first gate layer, a second gate layer and a source-drain electrode layer of the thin film transistor pixel circuit, and an anode of the electroluminescence device.

In some embodiments, when the heightening layer and the source-drain electrode layer are arranged on the same layer, the heightening layer includes: a first metal layer, a second metal layer and a third metal layer stacked on the base substrate in sequence;

an edge of the second metal layer is indent relative to edges of the first metal layer and the third metal layer.

In some embodiments, a distance between a surface of a side of the second blocking dam facing away from the base substrate and the base substrate is larger than a distance between a surface of a side of the first blocking dam facing away from the base substrate and the base substrate; and a distance between a surface of a side of the heightening layer facing away from the base substrate and the base substrate is smaller than the distance between the surface of the side of the first blocking dam facing away from the base substrate and the base substrate.

In some embodiments, the distance between the surface of the side of the heightening layer facing away from the base substrate and the surface of the side of the first blocking dam facing away from the base substrate is smaller than or equal to 3.4 micrometers.

In some embodiments, the display area further includes: a touch module located on the side of the encapsulation structure facing away from the base substrate;

the touch module includes: a first touch electrode layer, a touch insulation layer located on a side of the first touch electrode layer facing away from the base substrate, and a second touch electrode layer located on a side of the touch insulation layer facing away from the first touch electrode layer; and the crack detect wire and the connection leading wires are arranged on a same layer as the first touch electrode layer; or the crack detect wire and the connection leading wires are arranged on a same layer as the second touch electrode layer.

In some embodiments, the heightening layer surrounds the second blocking dam.

In some embodiments, the encapsulation structure includes: a first inorganic encapsulation layer, an organic encapsulation layer and a second inorganic encapsulation layer stacked on the base substrate in sequence;

the first inorganic encapsulation layer and the second inorganic encapsulation layer extend from the display area to an edge of the hole area, and the organic encapsulation layer extends from the display area to an edge of one side of the first blocking dam close to the display area.

An embodiment of the present application provides a method for preparing a display panel, including:

providing a base substrate; the display panel is provided with a hole area, a display area surrounding the hole area, and a blocking area located between the display area and the hole area;

forming a first blocking dam, a second blocking dam and a heightening layer on the base substrate in the blocking area; the first blocking dam surrounds the hole area, the second blocking dam surrounds the first blocking dam and is located on one side of the first blocking dam facing away from the display area, and the heightening layer is located between the first blocking dam and the second blocking dam; and forming a crack detect wire on one side of the second blocking dam close to the hole area and forming at least two connection leading wires leading the crack detect wire out to the display area through the blocking area;

in a direction perpendicular to a plane where the display panel is located, an orthographic projection of an area between the connection leading wires has an overlap area with an orthographic projection of the heightening layer.

An embodiment of the present application provides a display apparatus, including: the display panel provided by embodiments of the present application.

BRIEF DESCRIPTION OF THE DRAWINGS

In order to describe technical solutions in embodiments of the present application more clearly, accompanying drawings needed in the description of embodiments will be briefly introduced. Obviously, the accompanying drawings in the following description illustrate only some of embodiments of the present application, and those ordinarily skilled in the art may obtain other drawings according to these accompanying drawings without creative work.

DETAILED DESCRIPTION OF THE EMBODIMENTS

Figure 1:
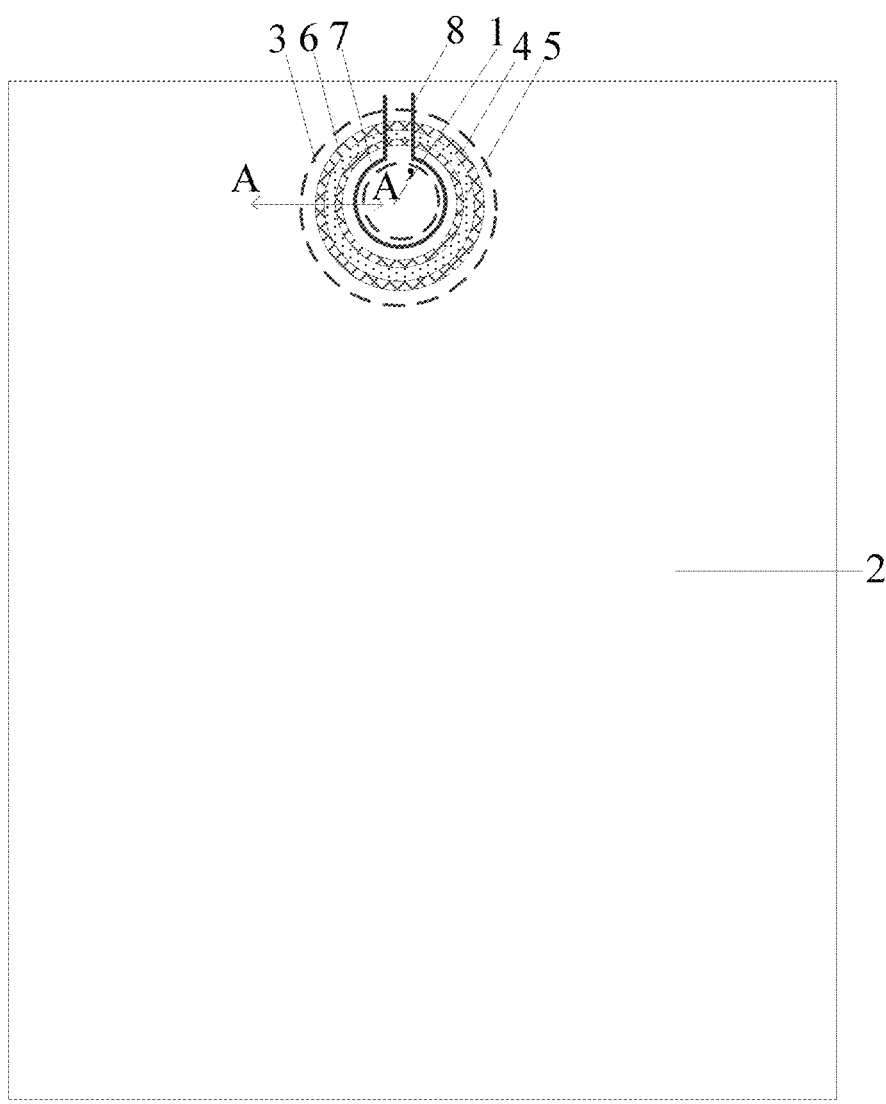
FIG. 1 is a schematic structural diagram of a display panel provided by an embodiment of the present application.

In order to make objectives, technical solutions and advantages of embodiments of the present application clearer, the technical solutions of the embodiments of the present application will be clearly and fully described below in combination with the accompanying drawings of embodiments of the present application. Obviously, the described embodiments are some, but not all of embodiments of the present application. Under the condition of no conflict, embodiments and features in the embodiments in the present application may be combined mutually. On the basis of the described embodiments of the present application, all other embodiments obtained by those ordinarily skilled in the art without creative work belong to the protection scope of the present application.

Unless otherwise defined, technical or scientific terms used in the present application should be understood commonly by those ordinarily skilled in the art of the present application. "First", "second" and other similar words used in the present application do not denote any sequence, quantity or significance, but are only used for distinguishing different components. "Include", or "comprise" and other similar words mean that elements or items preceding the words cover elements or items and their equivalents listed after the words without excluding other elements or items. "Connection" or "joint" and other similar words are not limited to physical or mechanical connection but also include electrical connection in spite of being direct or indirect.

It should be noted that sizes and shapes of all figures in the drawings do not reflect a true scale and only aim to illustrate contents of the present application. Moreover, same or similar reference numbers denote same or similar elements or elements with same or similar functions all the time.

In the related art, there are various problems in the technological development of holing in a display area. For example, a crack is prone to occurring during cutting of the display area and tends to extend to an effective display area in a subsequent process, which leads to failure in encapsulation and reduction of the reliability of a display product. Therefore, a crack detect wire is needed to detect and intercept the crack in time so as to guarantee the quality of the product. In the related art, a crack detect wire in an AA hole area usually strides across a blocking dam to be winded, the crack detect wire is prone to being short-circuited in a blocking dam area and does not have a crack detection function any more, and consequently the crack detection function is ineffective.

Figure 2:
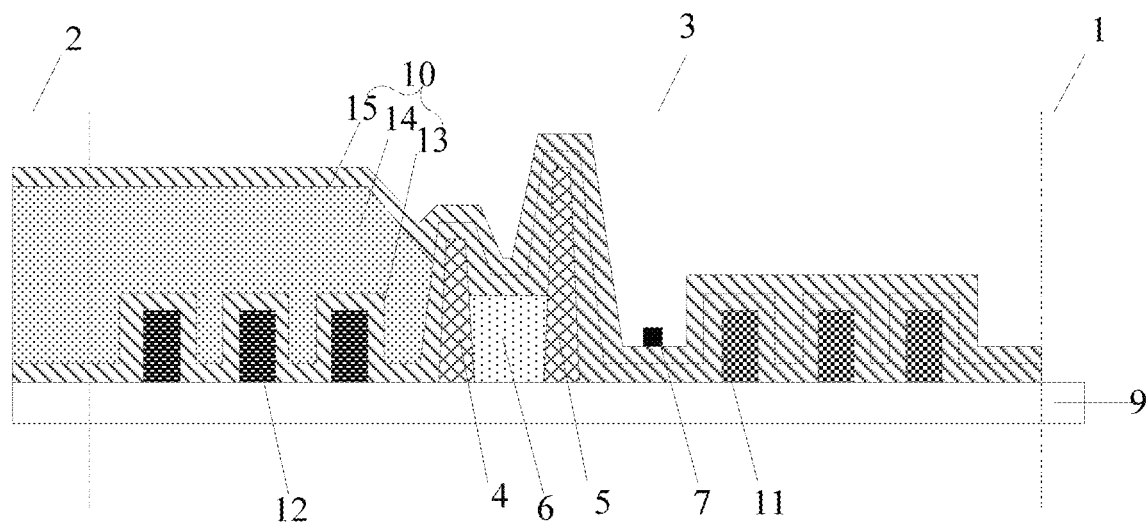
FIG. 2 is another schematic structural diagram of display panel provided by an embodiment of the present application.

An embodiment of the present application provides a display panel, as shown in FIG. 1 and FIG. 2, the display panel is provided with: a hole area 1, a display area 2 surrounding the hole area 1, and a blocking area 3 located between the display area 2 and the hole area 1; wherein FIG. 2 is a sectional view along AA' of FIG. 1.

The display panel includes: a first blocking dam 4 located in the blocking area 3 and surrounding the hole area 1, a second blocking dam 5 located on one side of the first blocking dam 4 close to the hole area 1 and surrounding the hole area 1, a heightening layer 6 located between the first blocking dam 4 and the second blocking dam 5, a crack detect wire 7 located on one side of the second blocking dam 5 close to the hole area 1, and at least two connection leading wires 8 leading the crack detect wire 7 out to the display area 2 through the blocking area 3.

In a direction perpendicular to a plane where the display panel is located, an orthographic projection of an area between the connection leading wires 8 has an overlap area with an orthographic projection of the heightening layer 6.

It should be noted that in the related art, a principle of detection through the crack detect wire is as follows: the crack detect wire is electrically connected with a data line of the display area, when a cutting area of the hole area cracks, if a crack extends continuously to a position of the crack detect wire, the crack detect wire breaks, and the display panel displays a vertical bright line in a light-on check step of the display panel. However, in the related art, as heights of the blocking dams are large, the breakage difference between the blocking dams and the adjacent area is large, film layers formed on the blocking dams is prone to underexposure, and, large-area residues occur in the area between the blocking dams. In a step of forming the crack detect wire and the connection leading wires electrically connected with the data line, if large-area residues occur in the area between the blocking dams, the connection leading wires are prone to being short-circuited, and in the light-on check step, a data signal transmitted by the data line does not pass through the crack detect wire any more, and consequently, the crack detect wire does not have the crack detection function any more.

According to the display panel provided by embodiments of the present application, the heightening layer is arranged between the first blocking dam and the second blocking dam so that the breakage difference between the area between the first blocking dam and the second blocking dam, and the first blocking dam and the second blocking dam may be reduced. Then, in a preparation process of the display panel, the breakage difference between the electrode layers formed on the area between the first blocking dam and the second blocking dam, and the electrode layer formed on the first blocking dam or the second blocking dam may be reduced. In a process of forming the connection leading wires, the large-area residues of the film layers formed on the blocking dams caused by underexposure are not prone to occurring between the first blocking dam and the second blocking dam. Moreover, in the direction perpendicular to the plane where the display panel is located, the orthographic projection of the area between the connection leading wires has an overlap area with the orthographic projection of the heightening layer, thus short-circuit of the connection leading wires may be avoided, and the detection function of the crack detect wire is prevented from being ineffective.

In some embodiments, as shown in FIG. 1, the heightening layer 6 surrounds the second blocking dam 5. In some embodiments, for example, as shown in FIG. 1, an orthographic projection of the heightening layer 6 in the plane where the display panel is located fully fills an area between orthographic projections of the first blocking dam 4 and the second blocking dam 5 on the plane where the display panel is located.

In some embodiments, as shown in FIG. 2, the display panel further includes: a base substrate 9, an encapsulation structure 10 covering the display area 2 and the blocking area 3, and a crack blocking structure 11 located on one side of the crack detect wire 7 close to the hole area 1 in the blocking area 3;

in a direction perpendicular to a plane where the display panel is located, the first blocking dam 4, the second blocking dam 5, the heightening layer 6 and the crack blocking structure 11 are located between the base substrate 9 and the encapsulation structure 10; and the crack detect wire 7 and the connection leading wires are located on a side of the encapsulation structure 10 facing away the base substrate 9.

The encapsulation structure is configured to seal a device of the display area, and the crack blocking structure is configured to block the crack from extending to the display area.

In some embodiments, as shown in FIG. 2, the encapsulation structure 10 includes: a first inorganic encapsulation layer 13, an organic encapsulation layer 14 and a second inorganic encapsulation layer 15 stacked on the base substrate 9 in sequence. The first inorganic encapsulation layer 13 and the second inorganic encapsulation layer 15 extend from the display area 2 to an edge of the hole area 1, and the organic encapsulation layer 14 extends from the display area 2 to an edge of one side of the first blocking dam 4 close to the display area 2.

In some embodiments, as shown in FIG. 2, the display panel further includes: an isolation column 12 located on the side of the first blocking dam 4 close to the display area 2 in the blocking area 3. The isolation column isolates a light-emitting function layer of the display area and a light-emitting function layer of the blocking area, so that outside water vapor and oxygen may be effectively prevented from penetrating through the isolation column to enter the display area, that is, an isolation structure of the isolation column may effectively make the water vapor and oxygen stay outside the display area, and the water vapor and oxygen of the hole area may be prevented from being transmitted to the display area along a light-emitting layer so as to solve the problem of ineffective display.

In some embodiments, the display panel further includes:
a plurality of conductive layers located between the base substrate and the encapsulation structure in the display area; and the heightening layer and at least one of the conductive layers are arranged on the same layer.

According to the display panel provided by embodiments of the present application, the heightening layer and at least one of the conductive layers are arranged on the same layer so that a preparation process flow of the display panel may be simplified, the cost may be reduced, and the production efficiency may be improved.

Figure 3:
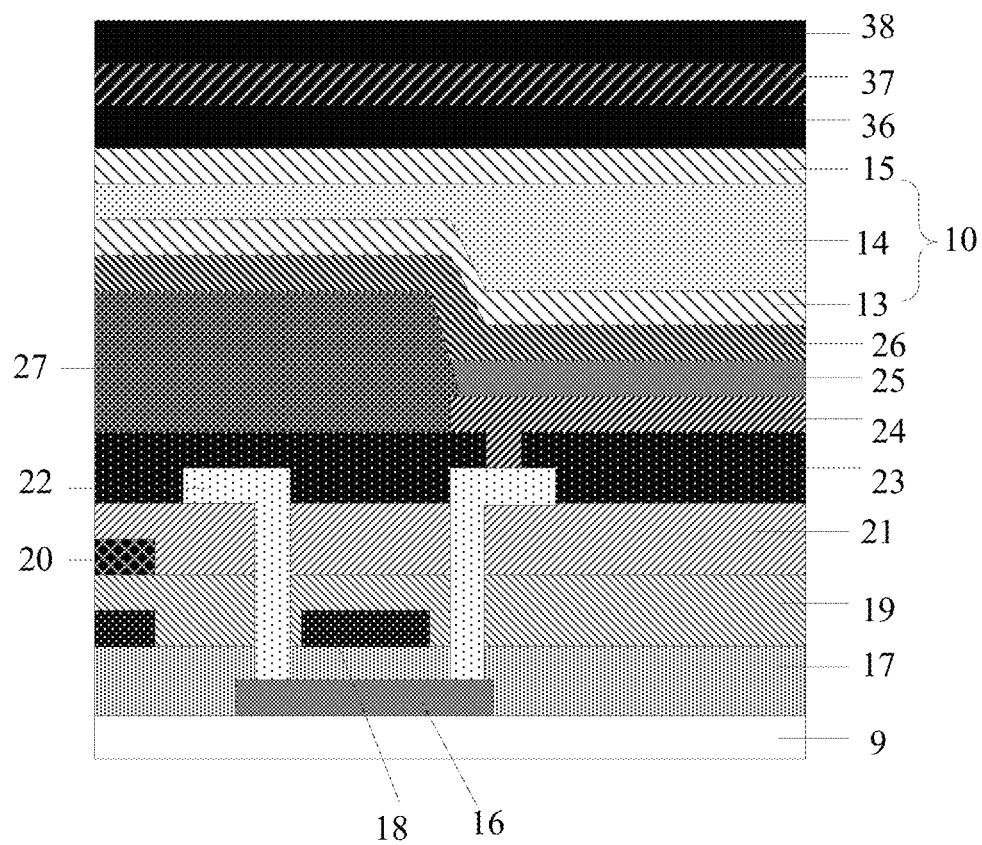
FIG. 3 is another schematic structural diagram of display panel provided by an embodiment of the present application.

In some embodiments, as shown in FIG. 3, a thin film transistor pixel circuit and an electroluminescence device electrically connected with the thin film transistor pixel circuit are located between the base substrate 9 and the encapsulation structure 10 in the display area;

the thin film transistor pixel circuit includes: an active layer 16, a first gate insulation layer 17, a first gate layer 18, a second gate insulation layer 19, a second gate layer 20, an interlayer insulation layer 21 and a source-drain electrode layer 22;

the display panel further includes a planarization layer 23, planarization layer 23 located on a side of the source-drain electrode layer 22 facing away the base substrate 9; and the electroluminescence device is located on a side of the planarization layer 23 facing away the base substrate 9, the electroluminescence device includes: an anode 24, the light-emitting function layer 25 located on the anode 24, and a cathode 26 located on the light-emitting function layer 25, and the display panel further includes a pixel defining layer 27 located on the planarization layer 23 and for dividing sub-pixels, and a supporting layer (not shown in figures) located on part of the pixel defining layer.

In some embodiments, the first gate layer includes, for example, a gate of a thin film transistor and a first electrode of a capacitor, and the second gate layer includes, for example, a second electrode of the capacitor. The source-drain electrode layer includes a source and a drain of the thin film transistor. The source-drain electrode layer is electrically connected with the active layer, and the anode is electrically connected with the source-drain electrode layer. FIG. 3 takes a top gate structure of the thin film transistor for example for illustration, and in some embodiments, the thin film transistor may select other structures.

In some embodiments, the conductive layers include: the first gate layer 18, the second gate layer 20 and the source-drain electrode layer 22 of the thin film transistor pixel circuit as well as the anode 24 of the electroluminescence device.

In some embodiments, the heightening layer and any one of the following conductive layers may be arranged on the same layer: the first gate layer 18, the second gate layer 20, the source-drain electrode layer 22 and the anode 24.

Figure 4:
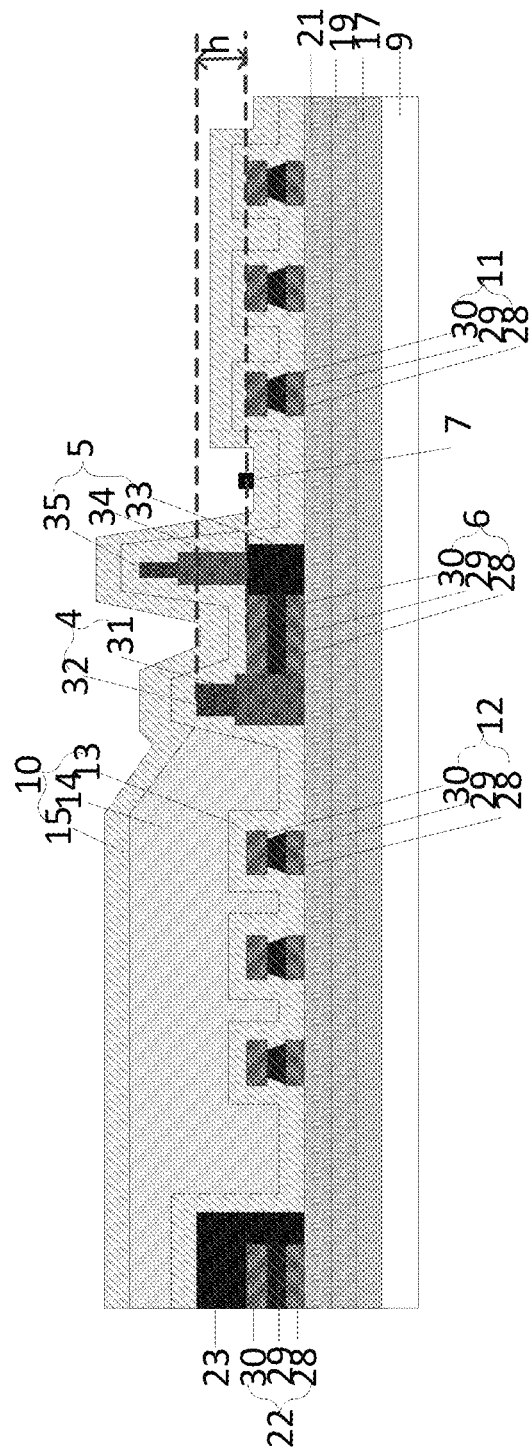
FIG. 4 is another schematic structural diagram of display panel provided by an embodiment of the present application.

In some embodiments, as shown in FIG. 4, the heightening layer 6 and the source-drain electrode layer 22 are arranged on the same layer.

In some embodiments, as shown in FIG. 4, both the crack blocking structure 11 and the isolation column 12 are arranged on the same layer as the source-drain electrode layer 22. That is, the heightening layer, the crack blocking structure and the isolation column are arranged on the same layer as the source-drain electrode layer, so that arrangement of the heightening layer, the crack blocking structure and the isolation column only needs to change an original mask during forming of the source-drain electrode layer, structures of the heightening layer, the crack blocking structure, the isolation column and the source-drain electrode layer may be formed through one-time patterning process, and patterns of other film layers do not need to change, so that the preparation process flow may be further simplified, the production cost is reduced, and the production efficiency is improved.

In some embodiments, as shown in FIG. 4, when the heightening layer 6, the crack blocking structure 11 and the isolation column 12 are arranged on the same layer as the source-drain electrode layer 22, the source-drain electrode layer 22, the heightening layer 6, the isolation column 12 and the crack blocking structure 11 each include: a first metal layer 28, a second metal layer 29 and a third metal layer 30 stacked in sequence. As shown in FIG. 4, in the crack blocking structure 11 and the isolation column 12, an edge of the second metal layer 29 is indent relative to edges of the first metal layer 28 and the third metal layer 30. Thus, the crack blocking structure may more effectively block the crack from extending, the light-emitting layer breaks at an edge of the isolation column while being formed, the broken light-emitting layer blocks a transmitting lath of the water and the oxygen, the water and the oxygen are prevented from entering the display area, and finally a requirement of the reliability is met.

In some embodiments, materials of the first metal layer and the third layer may be titanium, and a material of the second metal layer may be aluminum.

In some embodiments, as shown in FIG. 4, the first blocking dam 4 includes: a first secondary blocking dam 31 arranged on the same layer as the pixel defining layer, and a second secondary blocking dam 32 located on the first secondary blocking dam 31 and arranged on the same layer as the supporting layer. The second blocking dam 5 includes: a third secondary blocking dam 33 arranged on the same layer as the planarization layer, a fourth secondary blocking dam 34 located on the third secondary blocking dam 33 and arranged on the same layer as the pixel defining layer, and a fifth secondary blocking dam 35 located on the fourth secondary blocking dam 34 and arranged on the same layer as the supporting layer.

In some embodiments, a buffering layer is further included between the base substrate and the first gate insulation layer. In some embodiments, a material of the base substrate may include, for example, polyimide (PI).

In some embodiments, as shown in FIG. 3, the display area further includes: a touch module located on the encapsulation structure 10.

The touch module includes: a first touch electrode layer 36, a touch insulation layer 37 located on the first touch electrode layer 36, and a second touch electrode layer 38 located on the touch insulation layer 37.

In some embodiments, the crack detect wire and the connection leading wires are arranged on the same layer as the first touch electrode layer.

Or, in some embodiments, the crack detect wire and the connection leading wires are arranged on the same layer as the second touch electrode layer.

According to the display panel provided by embodiments of the present application, the crack detect wire and the connection leading wires are arranged on the same layer as the first touch electrode layer or the second touch electrode layer, and patterns of a touch electrode, the crack detect wire and the connection leading wires may be formed through the one-time patterning process, so that the fabrication process flow may be further simplified, the production cost may be reduced, and the production efficiency may be improved.

In some embodiments, as shown in FIG. 2 and FIG. 4, a distance between a surface of a side of the second blocking dam 5 facing away from the base substrate 9 and the base substrate 9 is larger than a distance between a surface of a side of the first blocking dam 4 facing away from the base substrate 9 and the base substrate 9.

A distance between a surface of a side of the heightening layer 6 facing away from the base substrate 9 and the base substrate 9 is smaller than the distance between the surface of the side of the first blocking dam 4 facing away from the base substrate 9 and the base substrate 9.

In some embodiments, as shown in FIG. 4, the distance h between the surface of the side of the heightening layer 6 facing away from the base substrate 9 and the surface of the side of the first blocking dam 4 facing away from the base substrate 9 is smaller than or equal to 3.4 micrometers.

Figure 5:
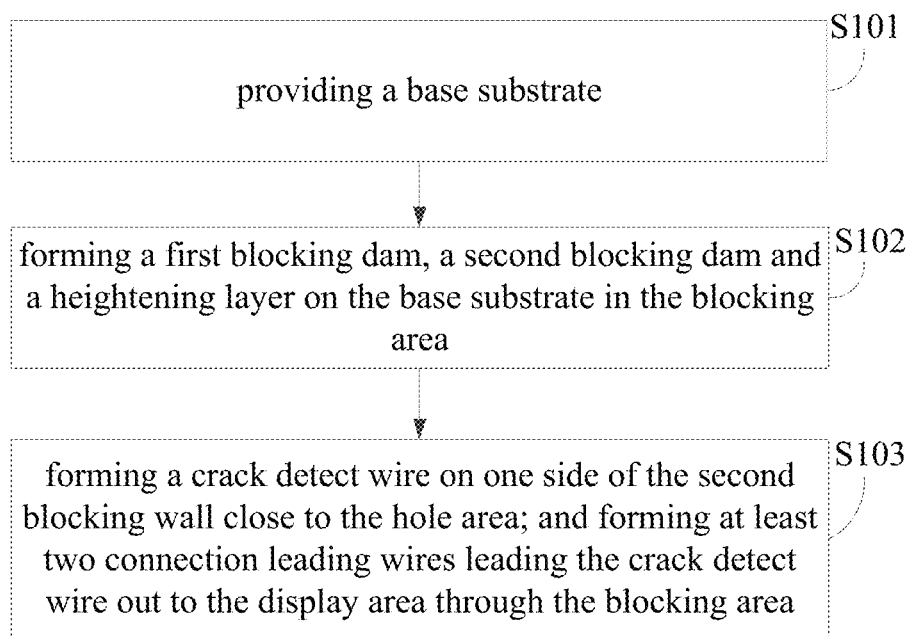
FIG. 5 is a schematic diagram of a preparation method of a display panel provided by an embodiment of the present application.

Based on the same inventive concept, an embodiment of the present application further provides a method for preparing a display panel, as shown in FIG. 5, including:

S101, a base substrate is provided; the display panel has a hole area, a display area surrounding the hole area, and a blocking area located between the display area and the hole area;

S102, a first blocking dam, a second blocking dam and a heightening layer are formed on the base substrate in the blocking area; the first blocking dam surrounds the hole area, the second blocking dam surrounds the first blocking dam and is located on one side of the first blocking dam facing away from the display area, and the heightening layer is located between the first blocking dam and the second blocking dam; and S103, a crack detect wire is formed on one side of the second blocking dam close to the hole area, and at least two connection leading wires leading the crack detect wire out to the display area through the blocking area are formed; in a direction perpendicular to a plane where the display panel is located, an orthographic projection of an area between the connection leading wires overlaps with an orthographic projection of the heightening layer.

According to the method for preparing the display panel provided by embodiments of the present application, the heightening layer is arranged between the first blocking dam and the second blocking dam. So that, the breakage difference between the area between the first blocking dam and the second blocking dam, and the first blocking dam and the second blocking dam may be reduced. Then, in a preparation process of the display panel, the breakage difference between the electrode layers formed on the area between the first blocking dam and the second blocking dam, and the electrode layer formed on the first blocking dam or the second blocking dam may be reduced. In a process of forming the connection leading wires, large-area residues of the film layers formed on the blocking dams caused by underexposure are not prone to occurring between the first blocking dam and the second blocking dam, so that short-circuit of the connection leading wires may be avoided, and a detection function of the crack detect wire is prevented from being ineffective.

In some embodiments, the method further includes:

conductive layers including a first gate layer, a second gate layer, a source-drain electrode layer and an anode are formed in sequence on the base substrate in the display area.

Forming the heightening layer includes:

a pattern of the heightening layer is formed while at least one of the conductive layers is formed.

According to the method for preparing the display panel provided by embodiments of the present application, the heightening layer and at least one of the conductive layers are arranged on the same layer so that a fabrication process flow of the display panel may be simplified, the cost may be reduced, and the production efficiency may be improved.

In some embodiments, forming the heightening layer specifically includes:

the pattern of the heightening layer is formed while the source-drain electrode layer is formed.

In some embodiments, the method further includes: a pattern of an isolation column and a pattern of a crack blocking structure are formed while a pattern of a first touch electrode layer is formed through one patterning process; the isolation column is located on one side of the first blocking dam close to the display area, and the crack blocking structure is located on one side of the second blocking dam close to the hole area.

In some embodiments, the crack detect wire is formed between the second blocking dam and the crack blocking structure.

In some embodiments, after the first blocking dam, the second blocking dam and the heightening layer are formed, the method further includes:

an encapsulation structure covering the display area, the blocking area and the hole area is formed;

a conductive material is deposited on the encapsulation structure, and the pattern of the first touch electrode layer is formed through the patterning process;

a touch insulation layer is formed on the first touch electrode layer; and a conductive material is deposited on the touch insulation layer, and a pattern of a second touch electrode layer is formed through the patterning process.

Forming the crack detect wire and at least two connection leading wires leading the crack detect wire out to the display area through the blocking area, includes:

a pattern of the crack detect wire is formed while the pattern of the first touch electrode layer is formed through the patterning process; or the pattern of the crack detect wire is formed while a pattern of the second touch electrode layer is formed through the patterning process.

According to the method for preparing the display panel provided by embodiments of the present application, the heightening layer is formed between the first blocking dam and the second blocking dam. So that, the breakage difference between the electrode layers formed on the area between the first blocking dam and the second blocking dam, and the electrode layer formed on the first blocking dam or the second blocking dam may be reduced. And, the electrode layers formed by depositing the conductive material. Then in a subsequent forming process, the large-area residues of the conductive material are not prone to occurring in the area between the first blocking dam and the second blocking dam, no matter whether the crack detect wire and the connection leading wires are arranged on the same layer as the first touch electrode layer or the second touch electrode layer, shot-circuit of the connection leading wires may be avoided, and the detection function of the crack detect wire is prevented from being ineffective.

In some embodiments, the patterning process includes, for example, photoresist coating, exposure, developing, etching and other steps.

An embodiment of the present application provides a display apparatus, including: the display panel provided by embodiments of the present application.

The display apparatus provided by embodiments of the present application is: a mobile phone, a tablet PC, a television, a display, a laptop, a digital photo frame, a navigator and any other products or components with a display function. The display apparatus also includes other necessary components, which should be understood by those ordinarily skilled in the art, will not be described in detail and should not limit the present application. Implementation of the display apparatus may be referred to the embodiment of the display panel, and repetition is omitted.

Embodiments of the present application provide the display panel, the preparation method thereof and the display apparatus. The heightening layer is arranged between the first blocking dam and the second blocking dam. So that, the breakage difference between the area between the first blocking dam and the second blocking dam, and the first blocking dam and the second blocking dam may be reduced. Then, in a preparation process of the display panel, the breakage difference between the electrode layers formed on the area between the first blocking dam and the second blocking dam, and the electrode layer formed on the first blocking dam or the second blocking dam may be reduced. In the process of forming the connection leading wires, large-area residues of the film layers formed on the blocking dams caused by underexposure is not prone to occurring between the first blocking dam and the second blocking dam. Thus, short-circuit of the connection leading wires may be avoided, and the detection function of the crack detect wire is prevented from being ineffective.

Apparently, those skilled in the art may make various changes and transformations for the present application without departing from the spirit and scope of the present application. In this case, if these changes and transformations of the present application belong to the scope of claims and their equivalents, the present application intends to include these changes and transformations.

What is claimed is:

1. A display panel, provided with:
   a hole area,
   a display area surrounding the hole area, and
   a blocking area located between the display area and the hole area;
   wherein the display panel comprises:
   a first blocking dam located in the blocking area and surrounding the hole area;
   a second blocking dam located on one side of the first blocking dam close to the hole area and surrounding the hole area;
   a heightening layer located between the first blocking dam and the second blocking dam;
   a crack detect wire located on one side of the second blocking dam close to the hole area; and
   at least two connection leading wires leading the crack detect wire out to the display area through the blocking area;
   wherein in a direction perpendicular to a plane where the display panel is located, an orthographic projection of an area between the connection leading wires has an overlap area with an orthographic projection of the heightening layer.

2. The display panel according to claim 1, further comprising:
   a base substrate;

an encapsulation structure covering the display area and the blocking area; and a crack blocking structure located on one side of the crack detect wire close to the hole area in the blocking area;

wherein the first blocking dam, the second blocking dam, the heightening layer and the crack blocking structure are located between the base substrate and the encapsulation structure; and the crack detect wire and the connection leading wires are located on a side of the encapsulation structure facing away the base substrate.

3. The display panel according to claim 2, further comprising:

a plurality of conductive layers located between the base substrate and the encapsulation structure in the display area;

wherein the heightening layer and at least one of the conductive layers are arranged on a same layer.

4. The display panel according to claim 3, wherein a thin film transistor pixel circuit and an electroluminescence device electrically connected with the thin film transistor pixel circuit are located between the base substrate and the encapsulation structure in the display area; and the conductive layers comprise:

a first gate layer, a second gate layer and a source-drain electrode layer of the thin film transistor pixel circuit; and an anode of the electroluminescence device.

5. The display panel according to claim 4, wherein when the heightening layer and the source-drain electrode layer are arranged on the same layer, the heightening layer comprises:

a first metal layer, a second metal layer and a third metal layer stacked on the base substrate in sequence;

wherein an edge of the second metal layer is indent relative to edges of the first metal layer and the third metal layer.

6. The display panel according to claim 2, wherein a distance between a surface of a side of the second blocking dam facing away from the base substrate and the base substrate is larger than a distance between a surface of a side of the first blocking dam facing away from the base substrate and the base substrate; and a distance between a surface of a side of the heightening layer facing away from the base substrate and the base substrate is smaller than the distance between the surface of the side of the first blocking dam facing away from the base substrate and the base substrate.

7. The display panel according to claim 6, wherein the distance between the surface of the side of the heightening layer facing away from the base substrate and the surface of the side of the first blocking dam facing away from the base substrate is smaller than or equal to 3.4 micrometers.

8. The display panel according to claim 2, wherein the display area further comprises: a touch module located on the side of the encapsulation structure facing away from the base substrate;

the touch module comprises:

a first touch electrode layer;

a touch insulation layer located on a side of the first touch electrode layer facing away from the base substrate; and a second touch electrode layer located on a side of the touch insulation layer facing away from the first touch electrode layer;

wherein the crack detect wire and the connection leading wires are arranged on a same layer as the first touch electrode layer; or the crack detect wire and the connection leading wires are arranged on a same layer as the second touch electrode layer.

9. The display panel according to claim 1, wherein the heightening layer surrounds the second blocking dam.

10. The display panel according to claim 2, wherein the encapsulation structure comprises: a first inorganic encapsulation layer, an organic encapsulation layer and a second inorganic encapsulation layer stacked on the base substrate in sequence;

wherein the first inorganic encapsulation layer and the second inorganic encapsulation layer extend from the display area to an edge of the hole area, and the organic encapsulation layer extends from the display area to an edge of one side of the first blocking dam close to the display area.

11. A display apparatus comprising the display panel according to claim 1.

12. The display apparatus according to claim 11, wherein the display panel further comprises:

a base substrate;

an encapsulation structure covering a display area and a blocking area; and a crack blocking structure located on one side of a crack detect wire close to the hole area in the blocking area;

wherein a first blocking dam, a second blocking dam, a heightening layer and the crack blocking structure are located between the base substrate and the encapsulation structure; and the crack detect wire and connection leading wires are located on a side of the encapsulation structure facing away the base substrate.

13. The display apparatus according to claim 12, wherein the display panel further comprises:

a plurality of conductive layers located between the base substrate and the encapsulation structure in the display area; and wherein the heightening layer and at least one of the conductive layers are arranged on a same layer.

14. The display apparatus according to claim 13, wherein a thin film transistor pixel circuit and an electroluminescence device electrically connected with the thin film transistor pixel circuit are located between the base substrate and the encapsulation structure in the display area; and the conductive layers comprise:

a first gate layer, a second gate layer and a source-drain electrode layer of the thin film transistor pixel circuit; and an anode of the electroluminescence device.

15. The display apparatus according to claim 14, wherein when the heightening layer and the source-drain electrode layer are arranged on the same layer, the heightening layer comprises:

a first metal layer, a second metal layer and a third metal layer stacked on the base substrate in sequence;

wherein an edge of the second metal layer is indent relative to edges of the first metal layer and the third metal layer.

16. The display apparatus according to claim 12, wherein a distance between a surface of a side of the second blocking dam facing away from the base substrate and the base substrate is larger than a distance between a surface of a side of the first blocking dam facing away from the base substrate and the base substrate; and a distance between a surface of a side of the heightening layer facing away from the base substrate and the base substrate is smaller than the distance between the surface of the side of the first blocking dam facing away from the base substrate and the base substrate.

17. The display apparatus according to claim 16, wherein the distance between the surface of the side of the heightening layer facing away from the base substrate and the surface of the side of the first blocking dam facing away from the base substrate is smaller than or equal to 3.4 micrometers.

18. The display apparatus according to claim 12, wherein the display area further comprises: a touch module located on the side of the encapsulation structure facing away from the base substrate;
the touch module comprises:
a first touch electrode layer;
a touch insulation layer located on a side of the first touch electrode layer facing away from the base substrate; and
a second touch electrode layer located on a side of the touch insulation layer facing away from the first touch electrode layer;
wherein the crack detect wire and the connection leading wires are arranged on a same layer as the first touch electrode layer; or the crack detect wire and the connection leading wires are arranged on a same layer as the second touch electrode layer.

19. The display apparatus according to claim 11, wherein the heightening layer surrounds the second blocking dam.

20. A method for preparing a display panel, comprising:
providing a base substrate; wherein the display panel is provided with a hole area, a display area surrounding the hole area, and a blocking area located between the display area and the hole area;
forming a first blocking dam, a second blocking dam and a heightening layer on the base substrate in the blocking area; wherein the first blocking dam surrounds the hole area, the second blocking dam surrounds the first blocking dam and is located on one side of the first blocking dam facing away from the display area, and the heightening layer is located between the first blocking dam and the second blocking dam; and
forming a crack detect wire on one side of the second blocking dam close to the hole area; and
forming at least two connection leading wires leading the crack detect wire out to the display area through the blocking area;
wherein in a direction perpendicular to a plane where the display panel is located, an orthographic projection of an area between the connection leading wires has an overlap area with an orthographic projection of the heightening layer.

* * * * *